United States Patent [19]

Suzuki et al.

[11] Patent Number: 5,376,974
[45] Date of Patent: Dec. 27, 1994

[54] PHASE-LOCKED LOOPED SYNCHRONOUS VIDEO DETECTOR CIRCUIT

[75] Inventors: Osamu Suzuki; Seiji Kawahara, both of Kanagawa, Japan

[73] Assignee: Kabushiki Kaisha Toshiba, Kawasaki, Japan

[21] Appl. No.: 138,982

[22] Filed: Oct. 21, 1993

[30] Foreign Application Priority Data

Oct. 23, 1992 [JP] Japan .................. 4-286404

[51] Int. Cl.$^5$ .......................................... H04N 5/50
[52] U.S. Cl. ........................... 348/735; 348/536
[58] Field of Search ............ 358/195.1, 188, 158; H04N 5/50; 348/735, 738, 536; 331/1 R, 18, 20

[56] References Cited

U.S. PATENT DOCUMENTS 4,031,549 6/1977 Rast et al. .................. 358/195.1

Primary Examiner—Victor R. Kostak
Attorney, Agent, or Firm—Oblon, Spivak, McClelland, Maier, & Neustadt

[57] ABSTRACT

A video detector has a PLL, a bias circuit, a synchronous detector for detecting a video IF signal by using the output of a VCO, and a lock detector for detecting whether the PLL is locked. The PLL has the VCO, a phase comparator, and a low-pass filter. In the video detector the supply of the direct current from the bias circuit is halted while said lock detector detects that the PLL is locked.

3 Claims, 8 Drawing Sheets

PHASE-LOCKED LOOPED SYNCHRONOUS VIDEO DETECTOR CIRCUIT

TECHNICAL FIELD

The present invention relates to a video detector circuit (a video detector) based on a synchronous detection method using a phase locked loop (PLL) applied to a television receiver system (TV system).

BACKGROUND ART

FIG. 1 is a block diagram showing a conventional video detector circuit. As shown in FIG. 1, the conventional video detector circuit basically consists of a voltage controlled oscillator (VCO) 1, a phase comparator 2, a filter 3, and a bias circuit 4. The phase comparator 2 compares a phase of the output of the V.C.O. 1 with an intermediate frequency (IF) signal input from a tuner (not shown). The filter 3 outputs a low frequency part in the output from the phase comparator 2. The bias circuit 4 applies a direct current bias (DC bias) to the output of the filter 3 in order to determine a free-running state of a Phase Locked Loop (PLL) which consists of the VCO 1, the phase comparator 2, and the filter 3. The VCO is controlled by the output from the filter 3 and the output of the filter 3 is biased by the DC bias from the bias circuit 4.

The detection circuit 5 synchronizes a phase of the video IF signal input from the tuner (not shown) with the phase of the output of the VCO 1, then detects it.

FIG. 2 is a more detailed diagram of the conventional video detector circuit, as shown in FIG. 1.

In FIG. 2, when the video IF signal is input to the phase comparator 2, the phase comparator 2 compares the phase and frequency of the video IF signal Vb input with the VCO frequency and outputs a voltage which is related to the frequency and phase difference between the video IF signal Vb and the VCO output, so that the output from the phase comparator 2 changes, namely increases and decreases, based on an amplitude of the video IF signal Vb input from the tuner (not shown) and the relationship between a phase difference $\phi$ and a voltage $V_A$ of the output from the filter circuit 3 at a point A. This difference $\phi$ is the phase difference between the phase of the output Va of the VCO 1 and the phase of the video IF signal Vb. In other words, the amplitude of the video IF signal Vb is changed and the output of the phase comparator 2 is changed irregularly of fluctuated by brightness of pictures to be displayed by a CRT (not shown) because the video IF signal Vb has been amplituded and modulated by a video signal.

For example, as shown in FIG. 3, when the phase difference $\phi$ between the output Va of the VCO 1 and the video IF signal Vb is 45 degree and the PLL lockes the video IF signal Vb, the amplitude of the video IF signal is fluctuated according to the brightness of the picture.

Specifically, the phase difference between the output of the VCO 1 and the video IF signal is 90° when the frequencies of the output of the VCO 1 and the video IF signal are equal.

In a case that the free-running frequency of the VCO 1 is away from the frequency of the video IF signal input, the relationship between the voltage $V_A$ at point A and the bias voltage in the bias circuit 4 becomes $V_A \neq V_{bias}$ when the VCO 1 is fed by the video IF signal, so that a current $I_R$ ($I_R = (V_A - V_{bias})/R$) flows through the resistance R. The current $I_R$ is provided from the phase comparator 2. This means that the phase difference between the VCO 1 and the video IF signal input is not 90° (degree). In this state, the output of the phase comparator 2 is fluctuated by the amplitude of the video IF signal input, namely by a picture to be displayed on a monitor. The larger there is the difference between the free-running frequency for the VCO 1 and the frequency of the video IF signal, the more the output from the phase comparator 2 is fluctuated by the video IF signal, namely the picture. It causes the change of tile oscillation frequency of the VCO 1, so that audio buzz at a speaker (not shown) is produced and a differential gain (DG) and a differential phase (DP) become poor.

Therefore it must be expected to increase the accuracy of the adjustment of a free-running state in the VCO 1 in order to avoid the problems described above.

SUMMARY OF THE INVENTION

An object of the present invention is to provide, with due consideration to the drawbacks of such conventional video detector circuit, an improved video detector circuit in which the audio buzz and the DG, and DP don't depend on the adjustment of a free-running state in a Voltage Controlled Oscillator (VCO), Accordingly, this object is achieved in the present invention by the provision of a video detector circuit, comprising:

a phase locked loop (PLL) consisting of:
  a voltage control oscillator (VCO) for oscillating a reference frequency;
  a phase comparator for comparing a phase of output of said VCO with a phase of video intermediate frequency (IF) signal input; and
  a filter for outputting a low frequency part of the output of said phase comparator,
a bias circuit for biasing the output of said filter with a direct current in order to determine a free-running frequency of said VCO;
a synchronous detector for detecting the video IF signal by using the output of said VCO in said PLL, which is synchronized with the phase of the video IF signal; and
a lock detector for detecting whether said PLL is locked,
wherein the supply of the direct current from said bias circuit is halt while said lock detector detects said PLL is locked.

In the video detecting circuit described above, said bias circuit further comprises a power supply and switching means, said switching means halts the supply of the direct current from said power supply to the VCO when said PLL is locked, and the switching means provides the supply of the direct current from said power supply to said VCO when said PLL is not locked.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Figure 4:
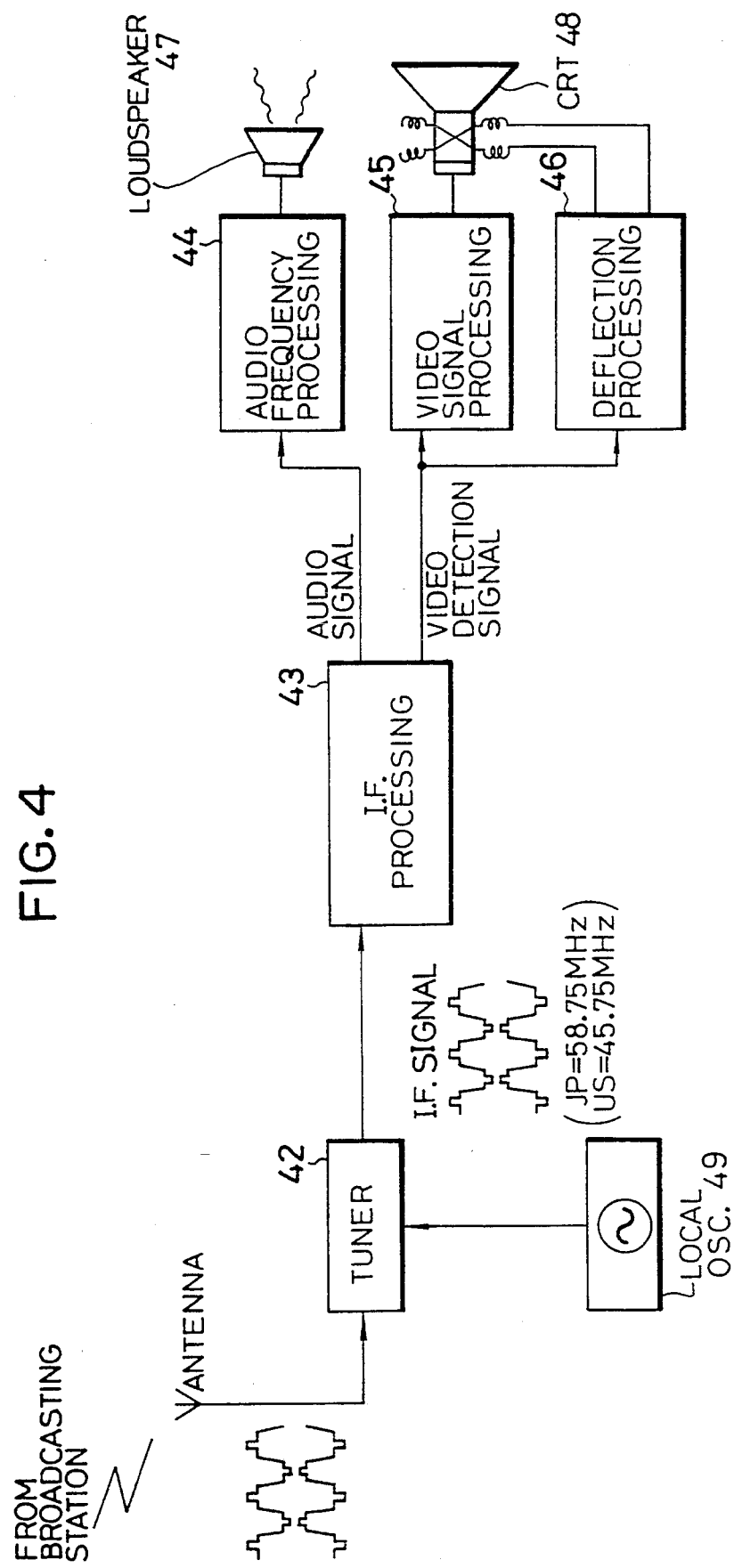
FIG. 4 is a block diagram showing a Television receiver system.

FIG. 4 is a block diagram of a television (TV) receiver system. Scenes projected by a TV camera at a television studio or a broadcasting station are transferred, then received by a TV receiver system shown in FIG. 4.

In FIG. 4, a tuner 42 selects an appropriate carrier frequency and then converts it to an Intermediate Frequency (IF) signal of 58.75 MHz in Japan, 45.75 MHz in U.S.A. based on a local oscillator 49. The modulated IF signal is amplified through several stages (not shown) and demodulated to produce the original composite video signal by a IF processing section 43. The composite signal demodulated is separated into its two component parts, an audio signal, and a video detection signal. The audio signal is then detected and amplified and fed into a loud speaker 47. The video signal is amplified and fed into a cathode ray tube (CRT).

Figure 5:
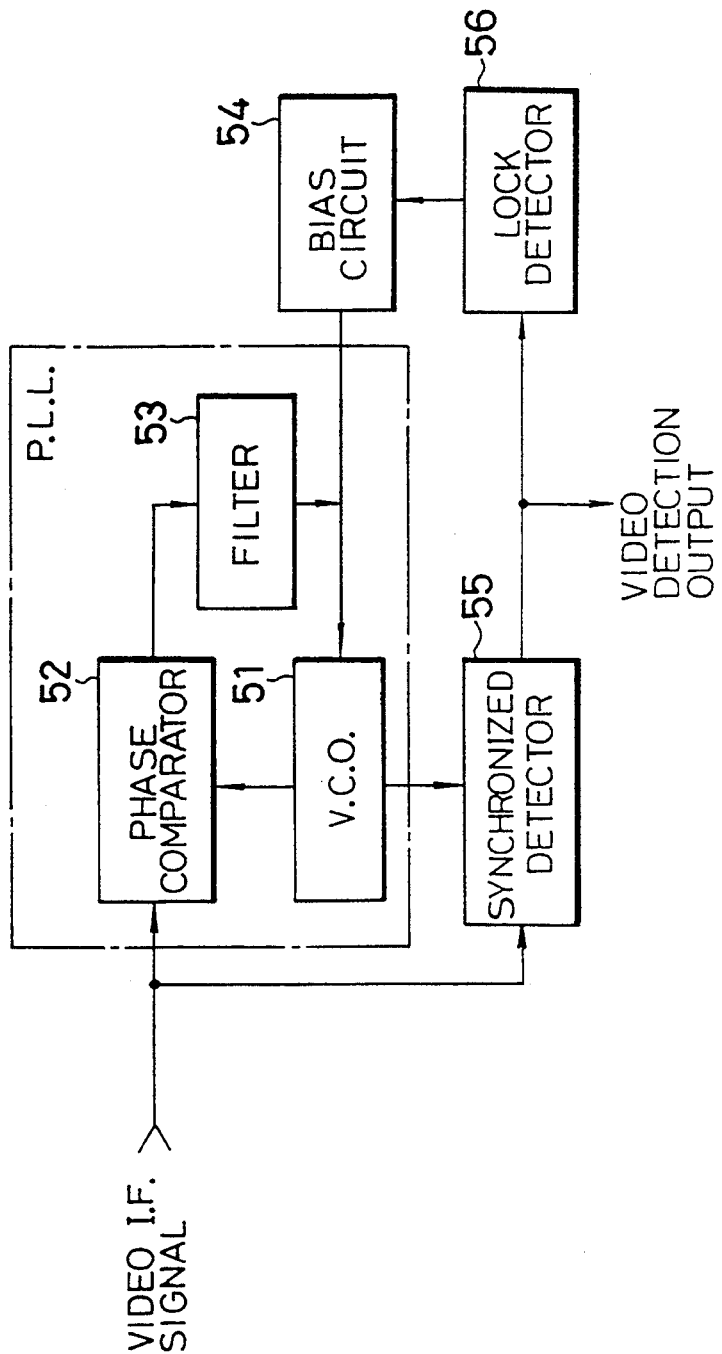
FIG. 5 is a block diagram showing a video detector circuit according to the present invention.

FIG. 5 is a block diagram of a video detector circuit 43 (or a video detector) or the IF processing section 43 of an embodiment shown in FIG. 4 according to a present invention.

Figure 6:
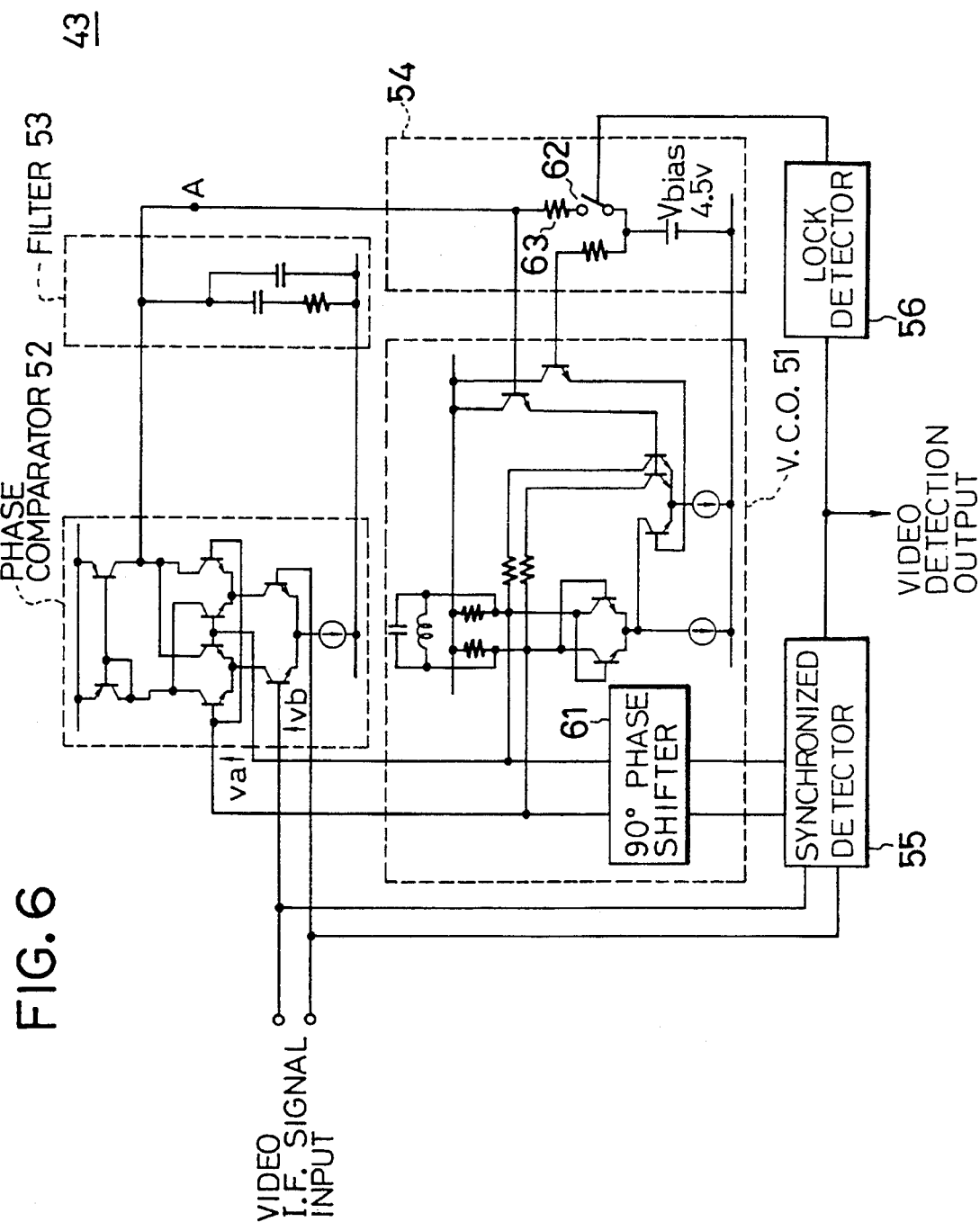
FIG. 6 is a detailed circuit diagram of the video detector circuit shown in FIG. 5.

In FIG. 5, the video detector circuit 43 includes a voltage controlled oscillator (VCO) 51, a phase comparator 52 which compares the phase of the VCO 51 itself and the phase of a video IF signal, a filter circuit or a filter 53 which selects a component of a low frequency part of the output from the phase comparator 52, a bias circuit 54 which applies a direct current bias to the output of the filter 53 in order to determine a free-running state of the VCO 51, a lock detector 56 to detect whether or not the PLL is locked, and a synchronous detector 55 which synchronizes and detects the output of the phase shifter 61 shown in FIG. 6 and the video IF signal.

Here, we define that the free-running state of the VCO 51 is a state in which the VCO 51 oscillates when no input is input to the VCO 51.

The bias circuit 54 has a switch 62, the function of which will be described later in detail, to turn on or turn off the bias voltage $V_{bias}$.

In the video detector circuit 43 according to the embodiment, a Phase Locked Loop (PLL) consists of the VCO 51, the phase comparator 52, and the filter 53. In the PLL, the operation of the VCO 51 is controlled by the output of the filter 53 whose output is biased with the direct current bias by the bias circuit 54.

FIG. 6 is a detailed circuit block diagram of the video detector system 43 shown in FIG. 5. In FIG. 6, the VCO 51 further has a phase shifter 61 which phases the output of the filter by 90° (degree). The feature or the basic concept of the video detector circuit 43 of the embodiment according to the present invention is that the switch 62 in the bias circuit 54 is cut off when the lock detector 56 detects that the PLL is locked.

We will describe the operation of the video detector circuit 43 of the embodiment of the present invention described above.

The lock detector 56 outputs a signal indicating a unlocked state when the PLL is unlocked in which the frequency of the video IF signal is out of the range of the phase locked state in the PLL or when no input signal is provided to the video detector circuit 43. In this unlocked state, the switch 62 in the bias circuit 54 is turned on. Therefore the VCO 51 oscillates at a free-running frequency.

The switch 62 in the bias circuit 54 is turned off when the lock detector 56 detects the phase locked state of the PLL when the frequency of the video IF signal is within the range of the phase locked state of the PLL based on the video detection output from the synchronous detector 55.

Figure 7:
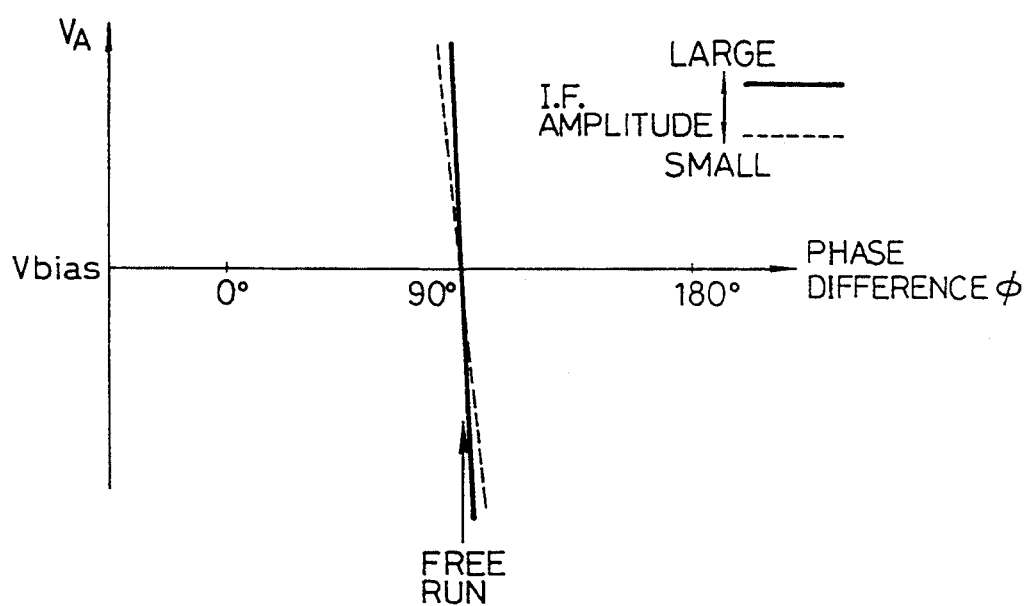
FIG. 7 is a graph showing a relationship between phase difference of two inputs and output at a phase comparator shown in FIG. 6.

FIG. 7 shows the relationship between the voltage $V_A$ of the filter 53 at the point A and the phase difference $\phi$ between two signals input to the phase comparator 52, namely the output $V_A$ of the VCO 51 and the video IF signal Vb, when the switch 62 in the bias circuit 54 is turned off.

Figure 1:
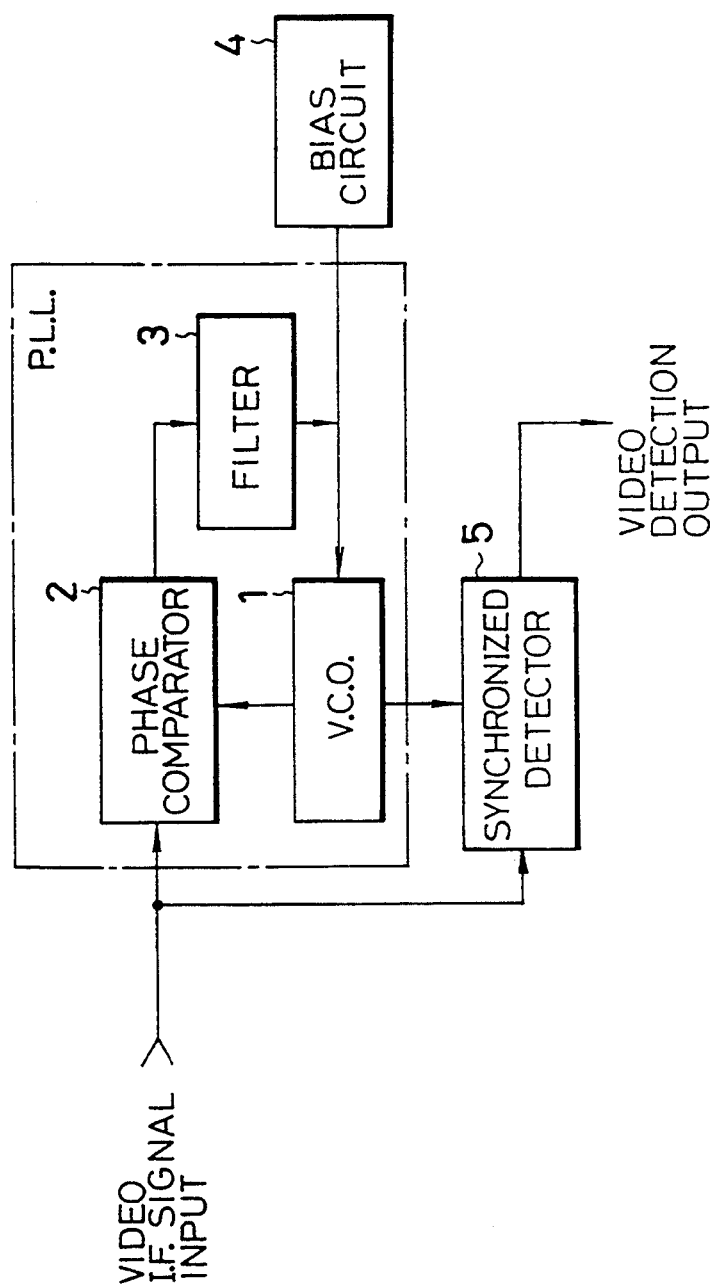
FIG. 1 is a block diagram showing a configuration of a conventional video detector circuit.
Figure 2:
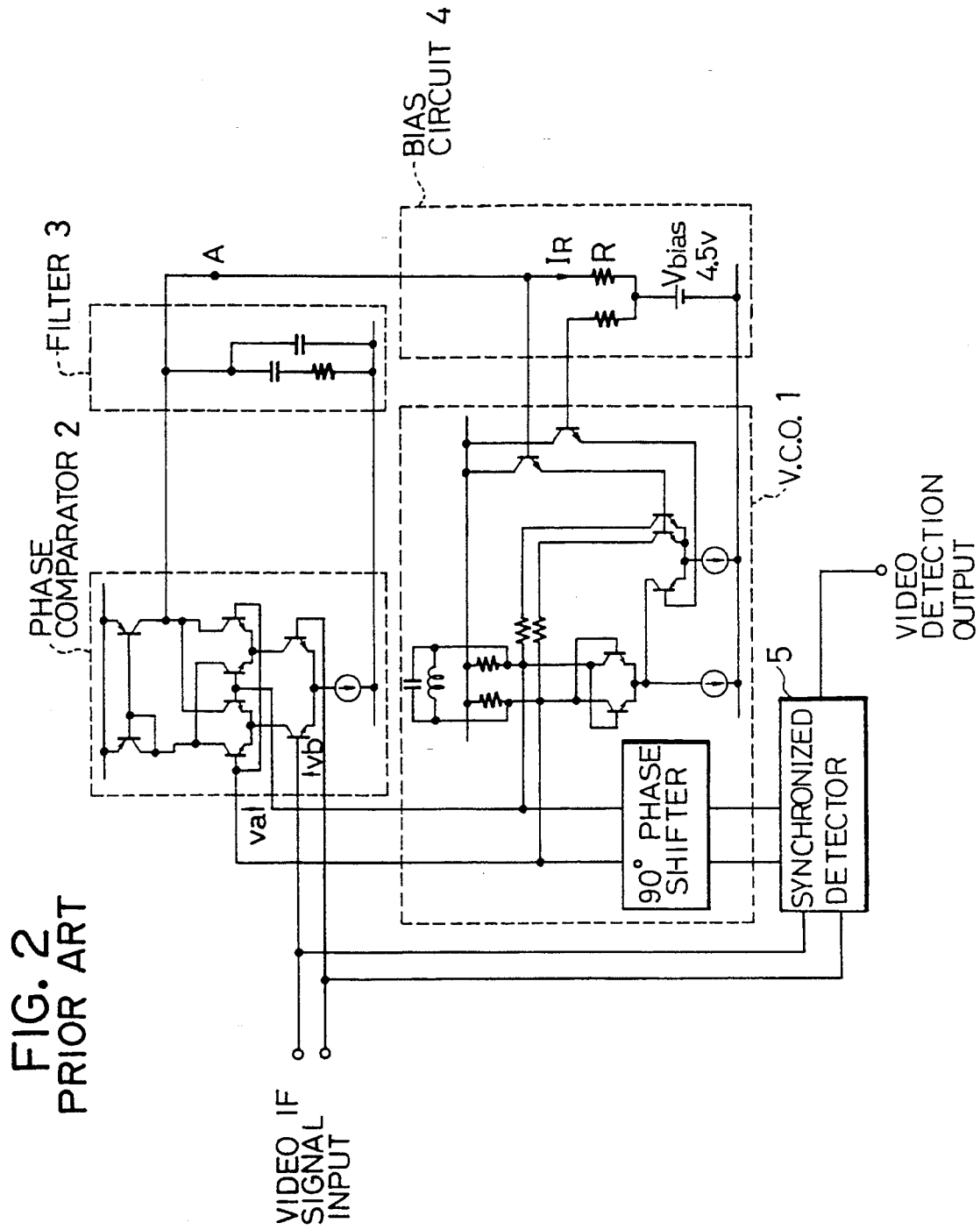
FIG. 2 is a detailed circuit diagram of the conventional video detector circuit shown in FIG. 1.
Figure 3:
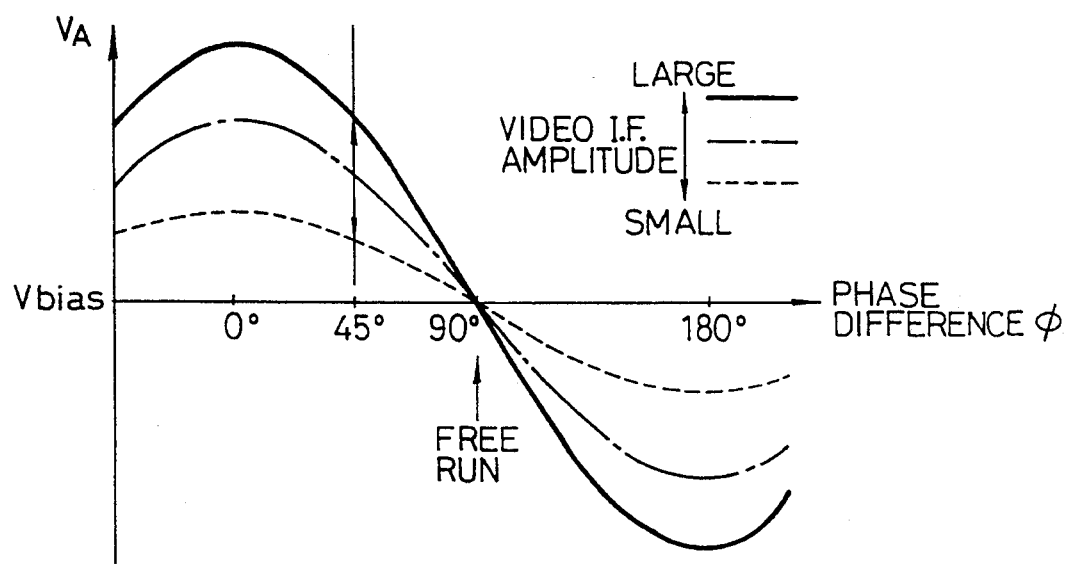
FIG. 3 is a graph showing a relationship between phase difference of two inputs and output at a phase comparator shown in FIG. 2.

Compared with the relationship between the phase difference $\phi$ and the voltage $V_A$ at the point A of the conventional video detector circuit shown in FIG. 3, the relationship of that shown in FIG. 7 according to the video detector circuit 43 of the embodiment according to the present invention indicates that the gain of the direct current of the phase comparator 52 is increased and the output of the phase comparator 52 is rapidly increased. Accordingly, the fluctuation or the change of the oscillation frequency of the VCO 51 in accordance with the amplitude of the video IF signal can be reduced. In FIG. 7, the vertical axis indicates the voltage $V_A$ of the output from the filter 53 at the point A and the horizontal axis indicates the phase difference $\phi$.

Since the switch 62 in the bias circuit 54 is turned off when the lock detector 56 does not detect the phase locked state of the PLL when the frequency of the video IF signal is within the range of the phase locked state of the PLL, the resistance component 63 in the bias circuit 54 doesn't be included into the entire load of the phase comparator 52, so that the output impedance of the phase comparator 52 is increased in direct current, as shown in FIG. 7.

The rapid increase, as clearly shown in FIG. 7, is also kept under the condition in which the free-running frequency of the VCO 51 is somewhat away from the range of the phase locked state because the phase difference of the video IF signal and the output of the VCO 51 is always kept near the 90° (degree) in order to reduce the fluctuation of the oscillation frequency in accordance with the amplitude of the video IF signal as a picture to be displayed.

Accordingly, the differential gain (DG) and the differential Phase (DP) does not deteriorate even if the adjustment of the free-running state is failed, so that a high quality picture may be played back at the CRT display in spite of the degree of the accuracy of the adjustment and elapsed time.

Figure 8:
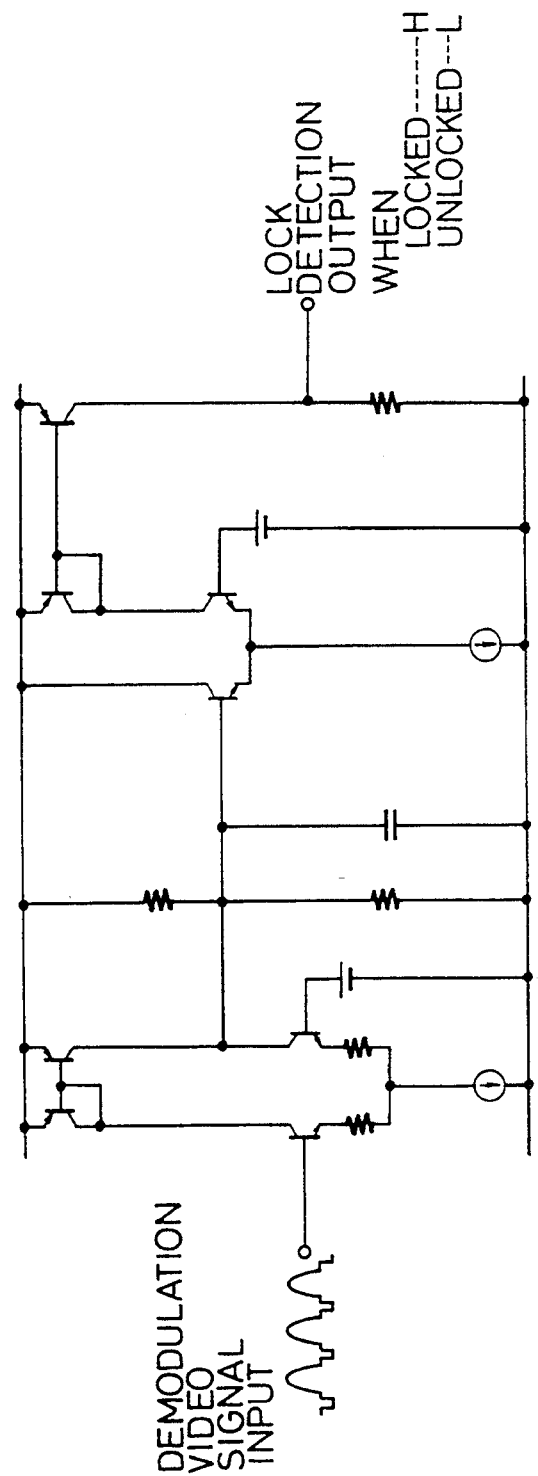
FIG. 8 is a circuit diagram showing a lock detector shown in FIG. 5.

FIG. 8 is a circuit diagram of the lock detector 56 shown in FIG. 5. The lock detector 56 outputs a lock detection signal to the bias circuit 54 in accordance with the demodulation video signal from the synchronous detector 55. When the PLL is locked the output of the lock detector 56 becomes a high level, and when unlocked the output becomes a low level.

Those skilled in the art will realize that the invention has been described by way of example making reference to but one preferred embodiment while describing or suggesting alternatives and modifications. All such modifications are intended to be within the spirit and scope of the following claims.

What is claimed is:

1. A video detector circuit, comprising:
    a phase locked loop (PLL) consisting of:
        a voltage control oscillator (VCO) for oscillating a reference frequency;
        a phase comparator for comparing a phase of output of said VCO with a phase of video intermediate frequency (IF) signal input; and
        a filter for outputting a low frequency part of the output of said phase comparator,
    a bias circuit for biasing the output of said filter with a direct current in order to determine a free-running frequency of said VCO;
    a synchronous detector for detecting the video IF signal by using the output of said VCO in said PLL, which is synchronized with the phase of the video IF signal; and
    a lock detector for detecting whether said PLL is locked,
    wherein the supply of the direct current from said bias circuit is stopped while said lock detector detects said PLL is locked.

2. A video detecting circuit as claimed in claim 1, wherein said bias circuit further comprises a power supply and switching means, said switching means halts the supply of the direct current from said power supply to the VCO when said PLL is locked, and the switching means provides the supply of the direct current from said power supply to said VCO when said PLL is not locked.

3. A television receiver system comprising:
    a tuner;
    a video detector circuit as claimed in claim 1 for inputting a video IF signal from said tuner;
    a audio and video signal processing means for inputting output from said video detector circuit and outputting a audio signal and a video signal;
    a loudspeaker for inputting the audio signal from said audio and video signal processing means; and
    a monitor for inputting the video signal from said audio and video signal processing means and displays a picture.

* * * * *